(12) United States Patent
Hara et al.

(10) Patent No.: US 10,503,860 B2
(45) Date of Patent: Dec. 10, 2019

(54) METHOD OF CREATING WRITING DATA

(71) Applicant: NuFlare Technology, Inc., Yokohama-shi (JP)

(72) Inventors: Shigehiro Hara, Kawasaki (JP); Kenichi Yasui, Kawasaki (JP); Yasuo Kato, Yokohama (JP)

(73) Assignee: NuFlare Technology, Inc., Yokohama-shi (JP)

( * ) Notice: Subject to any disclaimer, the term of this patent is extended or adjusted under 35 U.S.C. 154(b) by 17 days.

(21) Appl. No.: 15/925,089

(22) Filed: Mar. 19, 2018

(65) Prior Publication Data

US 2018/0285505 A1    Oct. 4, 2018

(30) Foreign Application Priority Data

Mar. 30, 2017    (JP) .................................. 2017-068045

(51) Int. Cl.
| | | |
|---|---|---|
| *G06F 17/50* | (2006.01) | |
| *H01J 37/302* | (2006.01) | |
| *H01J 37/317* | (2006.01) | |

(52) U.S. Cl.
CPC ...... *G06F 17/5072* (2013.01); *H01J 37/3026* (2013.01); *H01J 37/3177* (2013.01); (Continued)

(58) Field of Classification Search
CPC .................................................. G06F 17/5072 (Continued)

(56) References Cited

U.S. PATENT DOCUMENTS

| | | | | |
|---|---|---|---|---|
| 2012/0286174 A1* | 11/2012 | Gomi | .................. | H01J 37/3026 250/492.3 |
| 2016/0103945 A1* | 4/2016 | Yasui | .................. | G06F 17/5081 250/306 |

(Continued)

FOREIGN PATENT DOCUMENTS

| | | |
|---|---|---|
| JP | 2003-338460 | 11/2003 |
| JP | 2009-33025 | 2/2009 |

(Continued)

OTHER PUBLICATIONS

Korean Office Action dated Apr. 18, 2019 in Patent Application No. 10-2018-0035066, 9 pages (with unedited computer generated English translation).

(Continued)

*Primary Examiner* — Suresh Memula

(74) *Attorney, Agent, or Firm* — Oblon, McClelland, Maier & Neustadt, L.L.P.

(57) ABSTRACT

In one embodiment, a method is for creating writing data used in a multi charged particle beam writing apparatus. The method includes partitioning a polygonal figure included in design data into a plurality of trapezoids that each include at least one pair of opposite sides parallel along a first direction and that join so as to be continuous in a second direction orthogonal to the first direction while a side parallel to the first direction serves as a common side, and creating the writing data by, when a first trapezoid, a second trapezoid, and a third trapezoid join along the second direction, representing a position of a common vertex shared by the second trapezoid and the third trapezoid using displacements in the first direction and the second direction from a position of a common vertex shared by the first trapezoid and the second trapezoid. In at least one of the plurality of trapezoids, different dose amounts are defined in the first direction.

8 Claims, 11 Drawing Sheets

(52) U.S. Cl.
CPC ............... *H01J 2237/31762* (2013.01); *H01J 2237/31764* (2013.01); *H01J 2237/31769* (2013.01)

(58) Field of Classification Search
USPC .......................................................... 716/55
See application file for complete search history.

(56) References Cited

U.S. PATENT DOCUMENTS

| | | | |
|---|---|---|---|
| 2016/0155609 A1* | 6/2016 | Hara | H01J 37/3026 250/492.22 |
| 2018/0096094 A1* | 4/2018 | Huang | G06F 17/5081 |

FOREIGN PATENT DOCUMENTS

| | | |
|---|---|---|
| JP | 2015-95538 | 5/2015 |
| JP | 2016-76654 | 5/2016 |
| JP | 2016-111325 | 6/2016 |
| JP | 2017-123375 | 7/2017 |
| KR | 10-2016-0041765 A | 4/2016 |
| KR | 10-2016-0065029 A | 6/2016 |
| TW | 201626422 A | 7/2016 |
| TW | 201637074 A | 10/2016 |

OTHER PUBLICATIONS

Taiwanese Office Action with machine translation dated Sep. 5, 2019 in corresponding Taiwanese patent application 107104955, (8 pages).

\* cited by examiner

FIG. 2
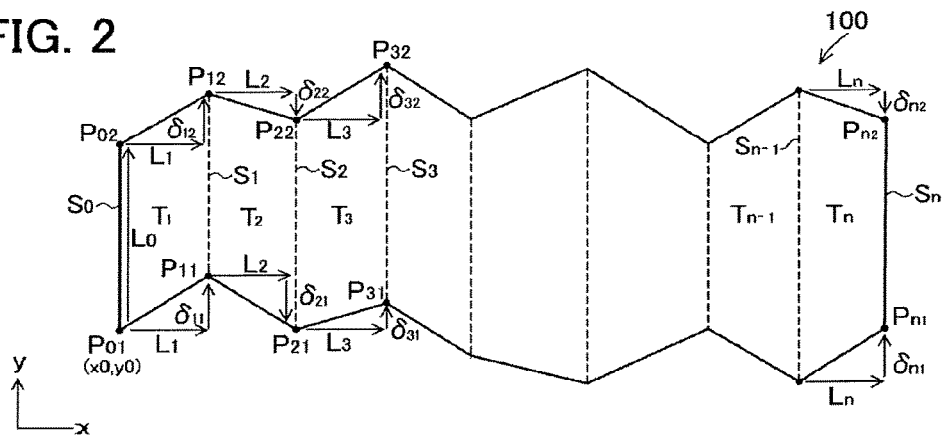
FIG. 3A
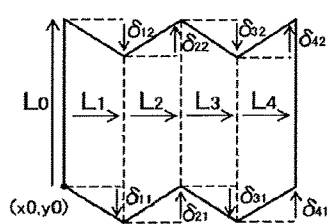
FIG. 3B
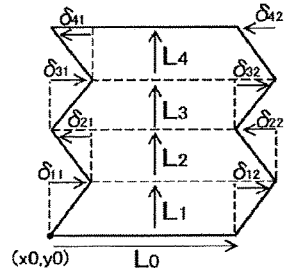
FIG. 3C
| PH | Code |
|----|------|
|    | flag |
|    | N    |
| EP | x0   |
|    | y0   |
|    | L0   |
|    | 4(=Nconnect) |
|    | L1   |
|    | $\delta_{11}$ |
|    | $\delta_{12}$ |
|    | L2   |
|    | $\delta_{21}$ |
|    | $\delta_{22}$ |
|    | L3   |
|    | $\delta_{31}$ |
|    | $\delta_{32}$ |
|    | L4   |
|    | $\delta_{41}$ |
|    | $\delta_{42}$ |

FIG. 4A
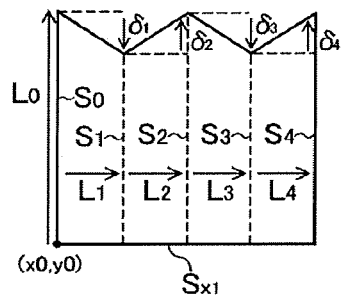
FIG. 4B
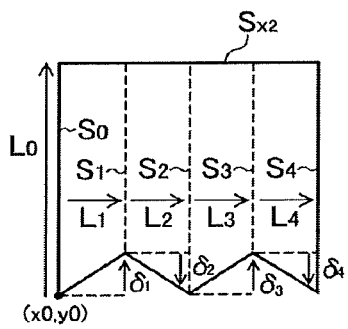
FIG. 4C
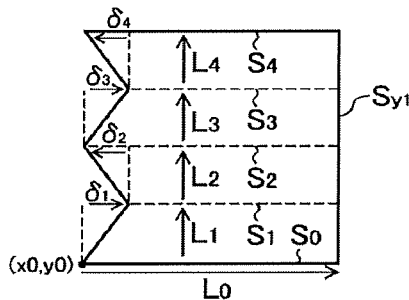
FIG. 4D
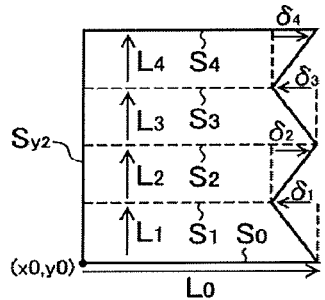
FIG. 4E
| PH | Code |
|---|---|
|  | flag |
|  | N |
| EP | x0 |
|  | y0 |
|  | L0 |
|  | 4(=Nconnect) |
|  | L1 |
|  | $\delta_1$ |
|  | L2 |
|  | $\delta_2$ |
|  | L3 |
|  | $\delta_3$ |
|  | L4 |
|  | $\delta_4$ |
FIG. 5A
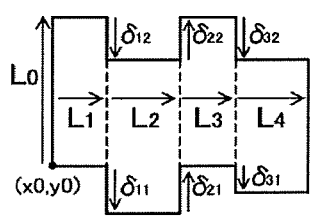
FIG. 5B
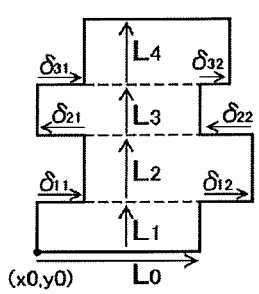
FIG. 5C
| PH | Code |
|---|---|
|  | flag |
|  | N |
| EP | x0 |
|  | y0 |
|  | L0 |
|  | 4(=Nconnect) |
|  | L1 |
|  | $\delta_{11}$ |
|  | $\delta_{12}$ |
|  | L2 |
|  | $\delta_{21}$ |
|  | $\delta_{22}$ |
|  | L3 |
|  | $\delta_{31}$ |
|  | $\delta_{32}$ |
|  | L4 |

FIG. 6A

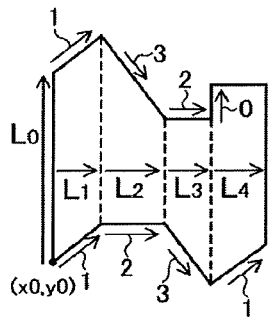

FIG. 6B

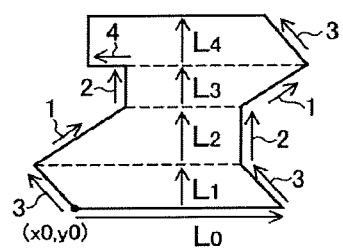

FIG. 6C

| PH | Code |
|---|---|
| | flag |
| | N |
| EP | x0 |
| | y0 |
| | L0 |
| | 4(=Nconnect) |
| | L1 |
| | 1 (=Direction Flag) |
| | 1 (=Direction Flag) |
| | L2 |
| | 2 (=Direction Flag) |
| | 3 (=Direction Flag) |
| | L3 |
| | 3 (=Direction Flag) |
| | 2 (=Direction Flag) |
| | L4 |
| | 1 (=Direction Flag) |
| | 0 (=Direction Flag) |

FIG. 6D

| Joining Direction | |
|---|---|
| Lateral Direction | Longitudinal Direction |
| 0↑ 1↗ →2 ↘3 ↓4 | 2↑ 3↖ ↗1 4← →0 |

FIG. 7

| PH | Code |
|---|---|
| | flag |
| | N |
| PHd | Code  flag  N |
| | AI$_1$ |
| | AI$_2$ |
| | ⋮ |
| | AI$_n$ |
| | Padding |
| EP | x0 |
| | y0 |
| | L0 |
| | Nconnect |
| | L$_1$ |
| | $\delta_{11}$ |
| | $\delta_{12}$ |
| | L$_2$ |
| | $\delta_{21}$ |
| | $\delta_{22}$ |
| | ⋮ |
| | L$_n$ |
| | $\delta_{n1}$ |
| | $\delta_{n2}$ |

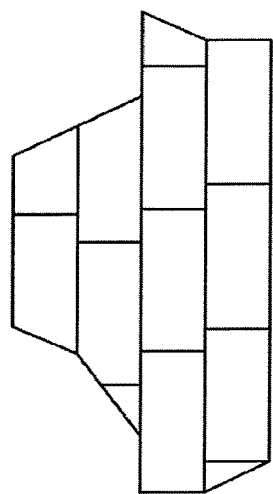
FIG. 12A
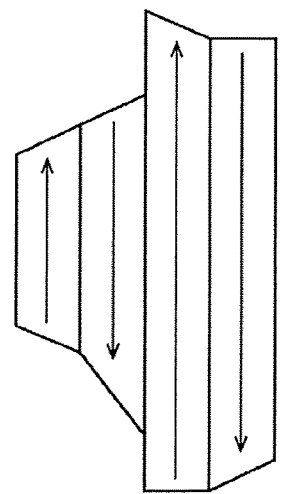
FIG. 12B
FIG. 13
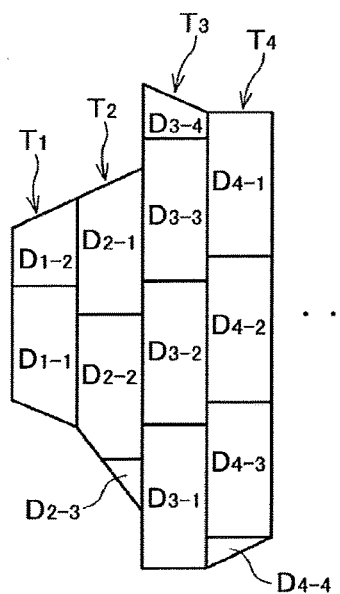

METHOD OF CREATING WRITING DATA

CROSS REFERENCE TO RELATED APPLICATION

This application is based upon and claims benefit of priority from the Japanese Patent Application No. 2017-68045, filed on Mar. 30, 2017, the entire contents of which are incorporated herein by reference.

FIELD

The present invention relates to a method of creating writing data.

BACKGROUND

With an increase in the packing density of LSIs, the required linewidths of circuits included in semiconductor devices become finer year by year. To form a desired circuit pattern on a semiconductor device, a method is employed in which a high-precision original pattern (i.e., a mask, or also particularly called reticle, which is used in a stepper or a scanner) formed on quartz is transferred to a wafer in a reduced manner by using a reduced-projection exposure apparatus. The high-precision original pattern is written by using an electron-beam writing apparatus, in which a so-called electron-beam lithography technique is employed.

As an electron beam writing apparatus, for example, a multi-beam writing apparatus is known, where radiation with a large number of beams is performed at a time using multiple beams to increase throughput. In the multi-beam writing apparatus, for example, electron beams emitted from an electron gun pass through an aperture member with a plurality of holes and multiple beams are formed consequently, and each beam undergoes blanking control on a blanking plate. The beams that have not been shielded are reduced through an optical system and a desirable position on a mask as a writing target is radiated with the resultant beams.

When electron beam writing is performed using a multi-beam writing apparatus, the layout of a semiconductor integrated circuit is designed first and design data is generated as layout data. By partitioning a polygonal figure included in the design data into a plurality of trapezoids, writing data to be input to the multi-beam writing apparatus is generated. With respect to each trapezoid, when one vertex serves as an arrangement origin point, the writing data includes coordinate data on the arrangement origin point and data indicating displacements from the arrangement origin point to the other three vertices.

When the design data includes a figure that is approximately presented by a polygonal figure having a large number of sides, such as an oval figure, the polygonal figure is partitioned into a large number of trapezoids. The data amount of the writing data is enormous since as regards each of the large number of trapezoids, the writing data includes the coordinate data on the arrangement origin point and the data indicating displacements from the arrangement origin point to the other three vertices.

To lessen the data amount of the writing data, a technique is proposed, by which a polygonal figure is partitioned into a plurality of trapezoid figures that each include at least one pair of opposite sides parallel along a first direction and join along a second direction orthogonal to the first direction while a side parallel to the first direction serves as a common side, and the position of a common vertex shared by a first trapezoid and a second trapezoid that adjoins the first trapezoid is represented using displacements in a first direction and a second direction from the position of a common vertex shared by the second trapezoid and a third trapezoid that adjoins the second trapezoid. According to this technique, the amount of one radiation (a dose amount) can be defined for each trapezoid.

As a phenomenon that causes variation in pattern dimension during electron beam writing, a proximity effect is known, which is unique to an EUV mask whose influence radius is exceedingly short like approximately 300 nm to 400 nm. When dose amount correction computing is performed while taking the effect into account, the computing needs to be performed on each of partitioned small regions, which are obtained through mesh partitioning for a writing region by approximately 30 nm to 100 nm for example.

According to the above-described conventional technique, even when the length of a trapezoid in the first direction is larger in size than a small region after the mesh partitioning, no more than one dose amount can be defined. It is thus difficult to perform the dose amount correction computing for inhibiting variation in pattern dimension.

BRIEF DESCRIPTION OF THE DRAWINGS

FIG. 2 illustrates an example of a partitioning process for a polygonal figure.

FIGS. 3A and 3B each illustrate an example of a partitioning process for a polygonal figure, and FIG. 3C illustrates an example of a data structure of writing data.

FIGS. 4A through 4D each illustrate an example of a partitioning process for a polygonal figure, and FIG. 4E illustrates an example of a data structure of writing data.

FIGS. 5A and 5B each illustrate an example of a partitioning process for a polygonal figure, and FIG. 5C illustrates an example of a data structure of writing data.

FIGS. 6A and 6B each illustrate an example of a partitioning process for a polygonal figure, FIG. 6C illustrates an example of a data structure of writing data, and FIG. 6D is a diagram for explaining direction flags.

FIG. 7 illustrates an example of a data structure of writing data.

FIG. 12A illustrates an example of a partitioning process for trapezoids and FIG. 12B illustrates a definition sequence of dose amounts.

FIG. 13 illustrates a dose amount defined for each section.

DETAILED DESCRIPTION

In one embodiment, a method is for creating writing data used in a multi charged particle beam writing apparatus. The method includes partitioning a polygonal figure included in design data into a plurality of trapezoids that each include at least one pair of opposite sides parallel along a first direction and that join so as to be continuous in a second direction orthogonal to the first direction while a side parallel to the first direction serves as a common side, and creating the writing data by, when a first trapezoid, a second trapezoid, and a third trapezoid join along the second direction, representing a position of a common vertex shared by the second trapezoid and the third trapezoid using displacements in the first direction and the second direction from a position of a common vertex shared by the first trapezoid and the second trapezoid. In at least one of the plurality of trapezoids, different dose amounts are defined in the first direction.

Hereinafter, an embodiment of the present invention will be described based on the drawings.

First Embodiment

Figure 1:
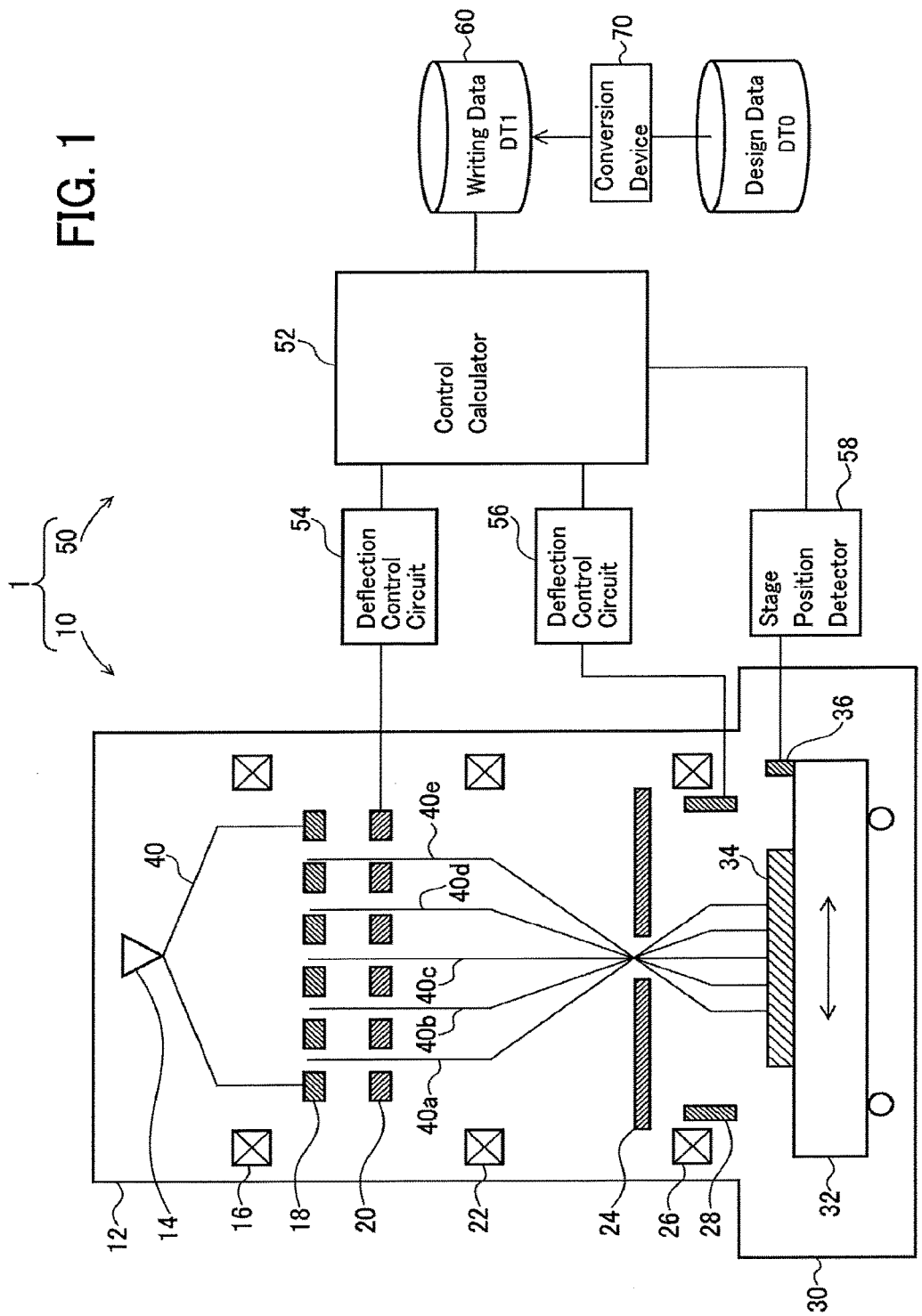
FIG. 1 is a schematic diagram of a multi charged particle beam writing apparatus according to a first embodiment of the present application.

FIG. 1 is a schematic diagram of a multi charged particle beam writing apparatus that performs writing using writing data according to a first embodiment of the present application. The present embodiment describes a structure that uses an electron beam as an example of a charged particle beam. The charged particle beam is not limited to an electron beam, and may be another charged particle beam, such as an ion beam.

A writing apparatus 1 illustrated in FIG. 1 includes a writing unit 10, which writes a desirable pattern by radiating a target, such as a mask or wafer, with an electron beam, and a control unit 50, which controls writing operation of the writing unit 10. The writing unit 10 includes an electron beam barrel 12 and a writing chamber 30.

In the electron beam barrel 12, an electron gun 14, an illumination lens 16, an aperture member 18, a blanking plate 20, a reduction lens 22, a limitation aperture member 24, an objective lens 26, and a deflector 28 are arranged. In the writing chamber 30, an XY stage 32 is arranged. On the XY stage 32, a mask blank 34 is placed as a writing target substrate.

Examples of the writing target substrate include a wafer and a mask for exposure to light, which transfers a pattern to a wafer using a reduction projection exposure apparatus or an extreme-ultraviolet exposure apparatus, such as a stepper or scanner where an excimer laser serves as a light source. The writing target substrate may be a mask on which a pattern is already formed. For example, since a levenson-type mask needs two-time writing, a pattern may be written on the mask that has undergone writing once. On the XY stage 32, a mirror 36 for determining the position of the XY stage 32 is further arranged.

The control unit 50 includes a control calculator 52, deflection control circuits 54 and 56, and a stage position detector 58. The control calculator 52, the deflection control circuits 54 and 56, and the stage position detector 58 are coupled to each other through a bus.

An electron beam 40 emitted from the electron gun 14 illuminates the overall aperture member 18 with the illumination lens 16 approximately perpendicularly. In the aperture member 18, holes (openings) are formed at predetermined array pitches in matrix. For example, the electron beam 40 illuminates a region that includes all of the holes of the aperture member 18. As a result of part of the electron beam 40 passing through the plurality of holes, multiple beams 40a through 40e illustrated in FIG. 1 are formed.

In the blanking plate 20, passage holes are formed so as to correspond to the respective arrangement positions of the holes of the aperture member 18 and each passage hole is provided with a blanker constituted of a pair of two electrodes. With the voltage applied by the blankers, the electron beams 40a through 40e that pass through the respective passage holes are each deflected independently. Such deflection enables blanking control. In this manner, a plurality of blankers each perform blanking deflection for a corresponding beam among the multiple beams that pass through the plurality of holes of the aperture member 18.

The multiple beams 40a through 40e that have passed through the blanking plate 20 are reduced through the reduction lens 22 and proceed to the central hole formed in the limitation aperture member 24. The electron beams that have been deflected by the blankers of the blanking plate 20 deviate from the position of a central hole of the limitation aperture member 24 and are shielded by the limitation aperture member 24. In contrast, the electron beams that have not been deflected by the blankers of the blanking plate 20 pass through the central hole of the limitation aperture member 24.

In this manner, the limitation aperture member 24 shields each of the beams that have been deflected by the blankers of the blanking plate 20 so as to enter the beam-OFF state. The beams that pass through the limitation aperture member 24 before becoming beam-OFF after becoming beam-ON serve as beams for one shot. The multiple beams 40a through 40e that have passed through the limitation aperture member 24 are focused through the objective lens 26 to be a pattern image with a desirable reduction ratio. The beams (overall multiple beams) that have passed through the limitation aperture member 24 are collectively deflected by the deflector 28 in an identical direction and the respective radiation positions of the beams on the mask blank 34 are radiated with the resultant beams.

While the XY stage 32 moves continuously, the radiation positions of the beams are controlled by the deflector 28 so as to follow the movement of the XY stage 32. The XY stage 32 is moved by a stage control unit, which is not illustrated, and the position of the XY stage 32 is detected by the stage position detector 58.

The multiple beams radiated at one time are ideally aligned at pitches obtained by multiplying the array pitches of the plurality of holes of the aperture member 18 by the above-described desirable reduction ratio. The present writing apparatus performs writing operation by raster scanning, where shot beams are radiated continuously and sequentially, and when a desirable pattern is written, beams needed according to the pattern are controlled to be beam-ON through the blanking control.

The control calculator 52 reads writing data DT1 from a storage device 60 and performs a data conversion process through a plurality of stages to generate shot data specific to the apparatus. In the shot data, the amount of radiation for each shot, radiation position coordinates, and the like are defined.

The control calculator 52 outputs the amount of radiation for each shot to the deflection control circuit 54 on the basis of the shot data. The deflection control circuit 54 determines radiation time t by dividing the input amount of radiation by current density. The deflection control circuit 54 applies a deflection voltage to the corresponding blankers of the blanking plate 20 so that when a corresponding shot is carried out, the blankers become beam-ON only for the radiation time t.

Further, the control calculator 52 outputs deflection position data to the deflection control circuit 56 so that each beam is deflected in a position (coordinates) indicated by the shot data. The deflection control circuit 56 computes the deflection amount and applies the deflection voltage to the deflector 28. Accordingly, the multiple beams that are shot at that time are collectively deflected.

A method of generating the writing data DT1 is described next. First, a layout of a semiconductor integrated circuit is designed and design data (CAD data) DT0 that serves as layout data is generated. After that, the design data DT0 is converted in the conversion device 70 and the writing data DT1 to be input to the control calculator 52 of the writing apparatus 1 is generated.

The design data DT0 includes a polygonal figure and the conversion device 70 performs a partitioning process for partitioning the polygonal figure into a plurality of trapezoids. The plurality of trapezoids generated in the partitioning process each include one pair of opposite sides parallel in a first direction (for example, a longitudinal direction). The plurality of trapezoids lie continuously in a second direction (for example, a lateral direction) orthogonal to the first direction. Adjoining trapezoids share sides parallel in the first direction as a common side.

For example, as illustrated in FIG. 2, a polygonal FIG. 100 is partitioned into a plurality of trapezoids $T_1$ through $T_n$ through a partitioning process. Here, n represents an integer larger than or equal to two. The trapezoids $T_1$ through $T_n$ each include one pair of opposite sides parallel in a longitudinal direction (y direction) and join in a lateral direction (x direction). For example, the trapezoid $T_2$ includes one pair of parallel sides $S_1$ and $S_2$, and the side $S_1$ serves as a common side shared with the trapezoid $T_1$ while the side $S_2$ serves as a common side shared with the trapezoid $T_3$. The respective sides $S_0$ and $S_n$ of the trapezoids $T_1$ and $T_n$ in both end portions in a joining direction do not serve as common sides.

Depending on the shape of a polygonal figure, various partitioning processes are performed as illustrated in FIGS. 3A and 3B, FIGS. 4A through 4D, FIGS. 5A and 5B, and FIGS. 6A and 6B.

Similar to FIG. 2, in FIG. 3A, a partitioning process is performed so that each trapezoid has one pair of opposite sides that are parallel along a longitudinal direction and join in a lateral direction. In FIG. 3B, a partitioning process is performed so that each trapezoid has one pair of opposite sides parallel along the lateral direction and joins in the longitudinal direction.

In FIG. 4A, a polygonal figure has parallel sides $S_0$ and $S_4$, which extend along a longitudinal direction, and a side $S_{x1}$, which connects the lower ends of the sides $S_0$ and $S_4$ and extends along a lateral direction. The plurality of trapezoids generated through the partitioning process each have one pair of opposite sides parallel along the longitudinal direction and join in the lateral direction, and the sides on the lower side are continuous like a straight line in the lateral direction.

In FIG. 4B, a polygonal figure has parallel sides $S_0$ and $S_4$, which extend along a longitudinal direction, and a side $S_{x2}$, which connects the upper ends of the sides $S_0$ and $S_4$ and extends along a lateral direction. The plurality of trapezoids generated through the partitioning process each have one pair of opposite sides parallel along the longitudinal direction and join in the lateral direction, and the sides on the upper side are continuous like a straight line in the lateral direction.

In FIG. 4C, a polygonal figure has parallel sides $S_0$ and $S_4$, which extend along a lateral direction, and a side $S_{y1}$, which connects the right ends of the sides $S_0$ and $S_4$ and extends along a longitudinal direction. The plurality of trapezoids generated through the partitioning process each have one pair of opposite sides parallel along the lateral direction and join in the longitudinal direction, and the sides on the right side are continuous like a straight line in the longitudinal direction.

In FIG. 4D, a polygonal figure has parallel sides $S_0$ and $S_4$, which extend along a lateral direction, and a side $S_{y2}$, which connects the left ends of the sides $S_0$ and $S_4$ and extends along a longitudinal direction. The plurality of trapezoids generated through the partitioning process each have one pair of opposite sides parallel along the lateral direction and join in the longitudinal direction, and the sides on the left side are continuous like a straight line in the longitudinal direction.

FIGS. 5A and 5B each illustrate a partitioning process in a case where a polygonal figure is structured only by sides that are parallel in a longitudinal direction or lateral direction. In this case, each polygonal figure is partitioned into a plurality of rectangles (rectangular shapes). FIG. 5A illustrates an example in which the partitioned rectangles join in the lateral direction and FIG. 5B illustrates an example in which the partitioned rectangles join in the longitudinal direction.

FIGS. 6A and 6B each illustrate a partitioning process in a case where a polygonal figure is structured only by sides that are parallel in a longitudinal direction or lateral direction and sides that form 45° relative to the longitudinal direction (lateral direction). FIG. 6A illustrates an example in which the partitioned trapezoids join in the lateral direction and FIG. 6B illustrates an example in which the partitioned trapezoids join in the longitudinal direction.

The conversion device 70 partitions a polygonal figure into a plurality of trapezoids and represents the position of a vertex of a trapezoid using displacements from the position of a vertex of an adjoining trapezoid to generate the writing data DT1. For instance, in the example illustrated in FIG. 2, the coordinates (x0,y0) of a vertex $P_{01}$ on the lower end of the side $S_0$ are defined as a figure arrangement origin point of the polygonal figure.

The position of a vertex $P_{02}$ on the upper end of the side $S_0$ is defined with the figure arrangement position origin point $P_{01}$ and a length $L_0$ of the side $S_0$ that extends from the arrangement position origin point $P_{01}$ perpendicularly.

The position of a vertex $P_{11}$ on the lower end of a side $S_1$ that is parallel to the side $S_0$ and adjoins the side $S_0$ is defined with a height $L_1$ of the trapezoid $T_1$ (distance between the side $S_0$ and the side $S_1$) and a displacement $\delta_{11}$ in the longitudinal direction, which is viewed from the adjoining vertex $P_{01}$. The position of a vertex $P_{12}$ on the upper end of the side $S_1$ is defined with the height $L_1$ of the trapezoid $T_1$ and a displacement $\delta_{12}$ in the longitudinal direction, which is viewed from the adjoining vertex $P_{02}$.

The position of a vertex $P_{21}$ on the lower end of a side $S_2$ that is parallel to the side $S_1$ and adjoins the side $S_1$ is defined with a height $L_2$ of the trapezoid $T_2$ and a displacement $\delta_{21}$ in the longitudinal direction, which is viewed from the adjoining vertex $P_{11}$. The position of a vertex $P_{22}$ on the upper end of the side $S_1$ is defined with the height $L_2$ of the trapezoid $T_2$ and a displacement $\delta_{22}$ in the longitudinal direction, which is viewed from the adjoining vertex $P_{12}$.

In other words, the positions of the vertices $P_{21}$ and $P_{22}$ shared by the trapezoids $T_2$ and $T_3$ are defined with the displacements $\delta_{21}$ and $\delta_{22}$ in the longitudinal direction from the positions of the vertices $P_{11}$ and $P_{12}$ shared by the trapezoids $T_1$ and $T_2$ and the displacement $L_2$ in the lateral direction.

Hereinafter, similarly, the position of a vertex $P_{m1}$ on the lower end of a side $S_m$ that is parallel to a side $S_{m-1}$ and adjoins the side $S_{m-1}$ is defined with a height $L_m$ of a trapezoid $T_m$ (distance between the side $S_{m-1}$ and the side $S_m$) and a displacement $\delta_{m1}$ in the longitudinal direction, which is viewed from an adjoining vertex $P_{(m-1)1}$. The position of a vertex $P_{m2}$ on the upper end of the side $S_m$ is defined with the height $L_m$ of the trapezoid $T_m$ and a displacement $\delta_{m2}$ in the longitudinal direction, which is viewed from an adjoining vertex $P_{(m-1)2}$. Here, m represents an integer from two to n.

In this manner, the shape of a joining trapezoid group corresponding to a polygonal figure can be defined with the coordinates (x0,y0) of the figure arrangement position origin point $P_{01}$, the length $L_0$ of the side $S_0$, the respective heights $L_1$ through $L_n$ of the trapezoids $T_1$ through $T_n$, and the displacements $\delta_{11}$ and $\delta_{12}$ through $\delta_{n1}$ and $\delta_{n2}$ in a direction orthogonal to the trapezoid joining direction, which are viewed from adjoining vertices. The displacements $\delta_{11}$ and $\delta_{12}$ through $\delta_{n1}$ and $\delta_{n2}$ are signed values. Each of the respective heights $L_1$ through $L_n$ of the trapezoids $T_1$ through $T_n$ can be regarded as a displacement in the trapezoid joining direction, which is viewed from an adjoining vertex.

FIG. 7 illustrates an example of a data structure of the writing data DT1 that defines a joining trapezoid group. The writing data DT1 includes a header PH, a header PHd, and shape information EP. In the header PH, a figure code (Code), a flag (flag), and a figure element number (N) are defined.

The figure code is information that indicates what partitioning process for a polygonal figure is performed on a joining trapezoid group and for example, indicates which of the partitioning processes in FIGS. 3A and 3B, FIGS. 4A through 4D, FIGS. 5A and 5B, and FIGS. 6A and 6B corresponds.

The flag of the header PH includes information necessary for identifying figure representation, such as the byte length of data included in the shape information EP, which is described below. The figure element number (N) indicates the number of joining trapezoid groups (polygonal figures) identical in figure code. Since the shape information EP is created for each joining trapezoid group, when the figure element number (N) is larger than or equal to two, a plurality of pieces of shape information are created.

The header PHd includes dose amounts $AI_1$ through $AI_n$ of the trapezoids $T_1$ through $T_n$. The flag of the header PHd indicates the byte length of data on the dose amounts $AI_1$ through $AI_n$, and the like. The element number N of the header PHd indicates the number of trapezoids for which the dose amounts are defined.

The shape information EP includes information for defining the shape of a joining trapezoid group, such as the coordinates (x0,y0) of the figure arrangement position origin point, the length $L_0$ of the side $S_0$, the respective heights $L_1$ through $L_n$ of the trapezoids $T_1$ through $T_n$, and the displacements $\delta_{11}$ and $\delta_{12}$ through $\delta_{n1}$ and $\delta_{n2}$ in a direction orthogonal to the trapezoid joining direction, which are viewed from adjoining vertices. Further, the shape information EP includes a joining number Nconnect of trapezoids.

For example, the writing data DT1 that represents the joining trapezoid groups illustrated in FIGS. 3A and 3B has a data structure as in FIG. 3C. In the data structure illustrated in FIG. 3C, the header PHd is omitted. In the figure code, the joining direction of trapezoids, the vertex that serves as the figure arrangement position origin point, and the like are defined so as to be determinable. The joining number Nconnect is four.

The writing data DT1 that represents the joining trapezoid groups illustrated in FIGS. 4A through 4D has a data structure as in FIG. 4E. In the data structure illustrated in FIG. 4E, the header PHd is omitted. In the figure code, the joining direction of trapezoids, the sides that are continuous like a straight line, the vertex that serves as the figure arrangement position origin point, and the like are defined so as to be determinable. The joining number Nconnect is four. In FIGS. 4A through 4D, one side of a trapezoid that joins is continuous like a straight line and between a vertex of this side and an adjoining vertex, no displacement is caused in the direction orthogonal to the trapezoid joining direction. Consequently, when the joining numbers Nconnect are identical, the data amount of the shape information EP is smaller than that according to FIGS. 3A and 3B.

The writing data DT1 that represents the joining trapezoid groups illustrated in FIGS. 5A and 5B has a data structure as in FIG. 5C. In the data structure illustrated in FIG. 5C, the header PHd is omitted. In the figure code, partitioning into a plurality of rectangles, the joining direction of the rectangles, the vertex that serves as the figure arrangement position origin point, and the like are defined so as to be determinable.

The writing data DT1 that represents the joining trapezoid groups illustrated in FIGS. 6A and 6B has a data structure as in FIG. 6C. In the data structure illustrated in FIG. 6C, the header PHd is omitted. In the shape information EP, the direction flags (flag) illustrated in FIG. 6D are defined. This is because when a polygonal figure is structured only by sides that are parallel in the longitudinal direction or lateral direction and sides that form 45° relative to a longitudinal direction (lateral direction). Each side can be represented with one of the direction flags in FIG. 6D. In the figure code, the joining direction of trapezoids, the vertex that serves as the figure arrangement position origin point, and the like are defined so as to be determinable. FIG. 6C illustrates the writing data DT1 that represents the joining trapezoid group in FIG. 6A.

In electron beam writing, as a phenomenon that causes variation in pattern dimension, a proximity effect is known, which is unique to an EUV mask whose influence radius is exceedingly short like approximately 300 nm to 400 nm. When dose amount correction computing is performed while taking the effect into account, the computing is performed on each of partitioned small regions, which are obtained through mesh partitioning for a writing region by approximately 30 nm for example.

Figure 8:
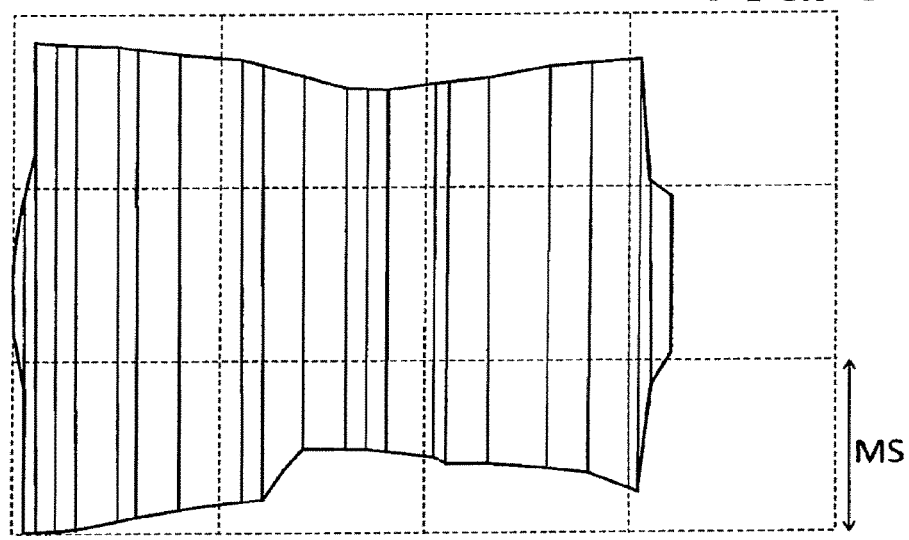
FIG. 8 illustrates an example of a partitioning process for a polygonal figure.

In the present embodiment, as illustrated in FIG. 8, when a trapezoid obtained by partitioning a polygonal figure is larger than a mesh size MS, one trapezoid is partitioned into a plurality of sections according to the mesh size MS and a dose amount is defined for each section.

Figure 9:
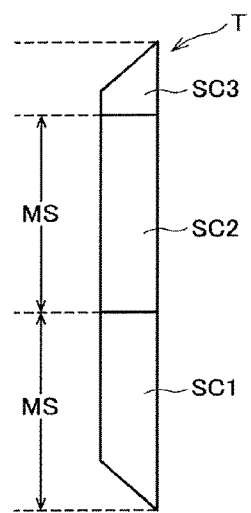
FIG. 9 illustrates an example in which a trapezoid is partitioned into a plurality of sections.

For example, as illustrated in FIG. 9, a trapezoid with a length in a longitudinal direction (a direction orthogonal to the joining direction of trapezoids) that is larger than a mesh size is partitioned into a plurality of sections according to the mesh size MS. One trapezoid includes at least one section of the mesh size MS and a small section smaller than the mesh size MS. When the size of a trapezoid is an integral multiple of the mesh size MS, no small section is caused.

In the example illustrated in FIG. 9, an example is presented, where one trapezoid T is partitioned into three sections SC1, SC2, and SC3. The size of each of the sections SC1 and SC2 in the longitudinal direction equals the mesh size MS. The section SC3 is a small section that is smaller than the mesh size MS. A dose amount is defined for each of the sections SC1, SC2, and SC3.

Figure 10A:
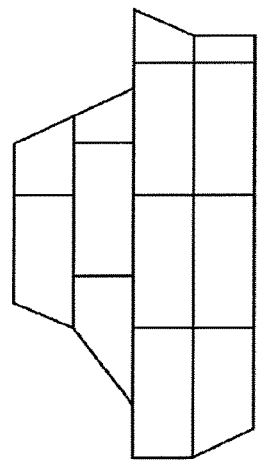
FIG. 10A illustrates an example of a partitioning process for trapezoids and FIG. 10B illustrates a definition sequence of dose amounts.
Figure 10B:
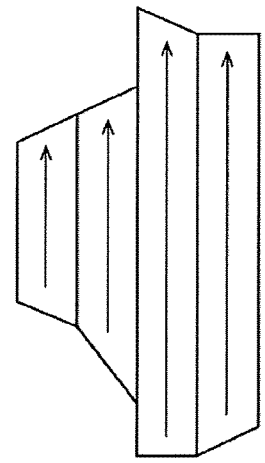
Figure 11A:
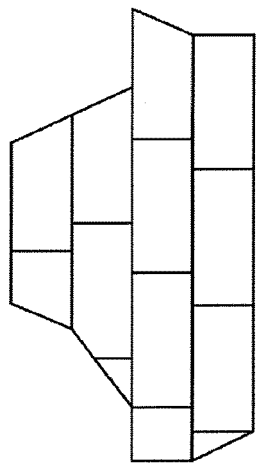
FIG. 11A illustrates an example of a partitioning process for trapezoids and FIG. 11B illustrates a definition sequence of dose amounts.
Figure 11B:
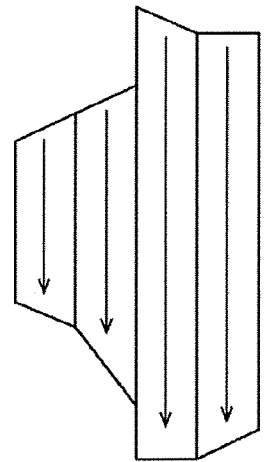

Examples of a method of partitioning a trapezoid into a plurality of sections and defining a dose amount for each section include what is illustrated in FIGS. 10 through 12. FIGS. 10A, 11A, and 12A illustrate examples in which trapezoids are partitioned into a plurality of sections while FIGS. 10B, 11B, and 12B illustrate sequences in defining a dose amount for each section using arrows. In these examples, the joining direction of trapezoids is in a left-right direction in each writing while the longitudinal direction of each trapezoid is in an up-down direction in each writing.

In FIGS. 10A and 10B, each trapezoid is partitioned into a plurality of sections from the lower end side according to a mesh size and dose amounts are sequentially defined upward from a section on the lower side.

In FIGS. 11A and 11B, each trapezoid is partitioned into a plurality of sections from the upper end side according to a mesh size and dose amounts are sequentially defined downward from a section on the upper side.

In FIG. 12A, trapezoids that are each partitioned into a plurality of sections from the lower end side according to a mesh size and trapezoids that are each partitioned into a plurality of sections from the upper end side according to a mesh size lie alternately. As illustrated in FIG. 12B, in a trapezoid partitioned into a plurality of sections from the lower end side according to a mesh size, dose amounts are sequentially defined upward from a section on the lower side. In a trapezoid partitioned into a plurality of sections from the upper end side according to a mesh size, dose amounts are sequentially defined downward from a section on the upper side. The definition sequences of the dose amounts zigzag.

FIG. 13 illustrates an example in which using the method illustrated in FIGS. 12A and 12B, trapezoids are partitioned into a plurality of sections and a dose amount is defined for each section. Odd-numbered trapezoids $T_1$, $T_3$, . . . are each partitioned into a plurality of sections from the lower end side according to a mesh size. Even-numbered trapezoids $T_2$, $T_4$, . . . are each partitioned into a plurality of sections from the upper end side according to the mesh size.

In the trapezoid $T_1$, dose amounts $D_{1-1}$ and $D_{1-2}$ are sequentially defined upward from a section on the lower side. In the trapezoid $T_2$, dose amounts $D_{2-1}$, $D_{2-2}$, and $D_{2-3}$ are sequentially defined downward from a section on the upper side. In the trapezoid $T_3$, dose amounts $D_{3-1}$, $D_{3-2}$, $D_{3-3}$, and $D_{3-4}$ are sequentially defined upward from a section on the lower side. In the trapezoid $T_4$, dose amounts $D_{4-1}$, $D_{4-2}$, $D_{4-3}$, and $D_{4-4}$ are sequentially defined downward from a section on the upper side.

Figures 14, 15:
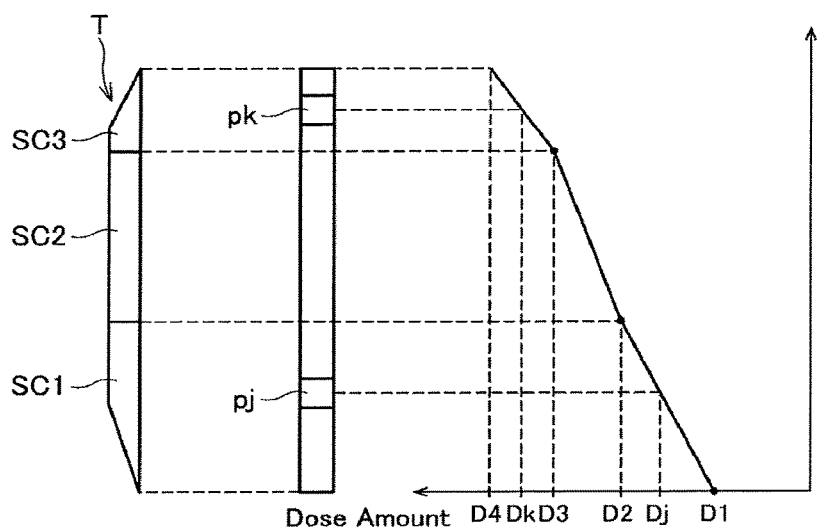
FIG. 14 illustrates an example of a data structure of writing data.
FIG. 15 illustrates a method of defining dose amounts according to a second embodiment.

FIG. 14 illustrates an example of a data structure of the writing data DT1 in a case where each trapezoid is partitioned into a plurality of sections according to a mesh size and a dose amount is defined for each section. The header PHd includes the mesh size MS and dose amounts $D_{1-1}$, $D_{1-2}$, $D_{2-1}$, $D_{2-2}$, . . . for each section of the plurality of trapezoids. When the mesh size MS has a fixed value all over a mask, defining the mesh size MS in the header PHd may be omitted.

In this manner, according to the present embodiment, a polygonal figure is regarded as a trapezoid group where a plurality of parallel trapezoids join in one direction, and only the figure arrangement position origin point is indicated with coordinates and the positions of the other vertices of a trapezoid is represented with displacements from an adjoining vertex to generate the writing data DT1. Thus, compared to a case where each trapezoid is represented with the coordinates of the arrangement position origin point and the displacements from the arrangement position origin point to the other three vertices, more data amount of the writing data can be reduced.

Each trapezoid is partitioned into a plurality of sections according to a small size (mesh size) to generate the writing data DT1 where a dose amount is defined for each section. Thus, correction computing for inhibiting variation in pattern dimension caused by a phenomenon of a small influence radius is enabled.

In the above-described embodiment, by performing a data compression process on dose amount information $D_{1-1}$, $D_{1-2}$, $D_{2-1}$, $D_{2-2}$, . . . on a plurality of sections defined in the header PHd of the writing data DT1, the data amount of the dose amount information may be cut.

For example, the dose amount information on the second section and the sections after the second section included in the dose amount information $D_{1-1}$, $D_{1-2}$, $D_{2-1}$, $D_{2-2}$, . . . on a plurality of sections defined in the header PHd is converted to difference representation between the dose amount of a section concerned and the dose amount of an immediately preceding section and the data length of the difference representation is changed according to the magnitude of the difference value. The dose amount information is converted to a data structure constituted of a header part and a value part as indicated in Table 1 below. In the example of Table 1, the dose amount before compression is 10 bits.

TABLE 1

| Header Part (2 bits) | | |
|---|---|---|
| Value | Meaning | Value Part |
| 00 | Full Bit | Unsigned 10 bits |
| 01 | Difference Representation 1 | Signed 8 bits (1-bit sign + 7 bits) |
| 10 | Difference Representation 2 | Signed 6 bits (1-bit sign + 5 bits) |
| 11 | Identical to the immediately preceding dose amount | None (0 bits) |

Regarding the dose amount of a certain section, when the difference from the dose amount of the immediately preceding section is larger than 32 levels and smaller than or equal to 128 levels, the dose amount is represented with a two-bit header "01", which indicates that the value part is difference representation 1, and the value part of signed eight bits, which indicates the difference from the dose amount of the immediately preceding section.

Regarding the dose amount of a certain section, when the difference from the dose amount of the immediately preceding section is smaller than or equal to 32 levels, the dose amount is represented with a two-bit header "10", which indicates that the value part is difference representation 2, and the value part of signed six bits, which indicates the difference from the dose amount of the immediately preceding section. Accordingly, the dose amount information is cut in data size from 10 bits to eight bits (=2 bits+6 bits).

When the dose amount of a certain section is identical to the dose amount of the immediately preceding section, the dose amount information is represented only with a two-bit header "11", which indicates that the dose amount is identical to the immediately preceding dose amount. Accordingly, the dose amount information is cut in data size from 10 bits to two bits.

Regarding the dose amount of a certain section, when the difference from the dose amount of the immediately preceding section is larger than 128 levels, the dose amount is regarded as the value part and a two-bit header "00" is added, which indicates that the value part is full-bit representation (unsigned 10 bits).

Table 2 indicates an example of conversion (data compression) of representation of the dose amount information. Although in Table 2, decimal notation is used for the dose amounts before compression and the value parts after compression for convenience of explanation, binary notation is used in actuality.

TABLE 2

|  | Before Compression | After Compression |  |  |
| --- | --- | --- | --- | --- |
|  |  | Header Part | Value Part | Number of bits |
| j-th section | 808 | 00 | 808 | 12 |
| j + 1-th section | 775 | 01 | −33 | 10 |
| j + 2-th section | 765 | 10 | −10 | 8 |
| j + 3-th section | 760 | 10 | −5 | 8 |
| j + 4-th section | 760 | 10 | None | 2 |

Regarding the jth section, the dose amount before compression enters the value part and a two-bit header "00" is added, which indicates that the value part is full-bit representation (unsigned 10 bits).

Regarding the j+1th section, since the difference from the dose amount of the jth section is larger than 32 levels and smaller than or equal to 128 levels, the header turns "01", which indicates that the value part is difference representation 1, and the difference from the dose amount of the jth section, −33 (signed eight bits), enters the value part.

Regarding the j+2th section, since the difference from the dose amount of the j+1th section is smaller than or equal to 32 levels, the header turns "10", which indicates that the value part is difference representation 2, and the difference from the dose amount of the j+1th section, −10 (signed six bits), enters the value part.

Regarding the j+3th section, since the difference from the dose amount of the j+2th section is smaller than or equal to 32 levels, the header turns "10", which indicates that the value part is the difference representation 2, and the difference from the dose amount of the j+2th section, −5 (signed six bits), enters the value part.

Regarding the j+4th section, since the dose amount is identical to that of the j+3th section, representation is converted only to a two-bit header "11".

In the example indicated in Table 2, the data size before compression of the dose amount information on the five sections is 10 bits×5=50 bits. In contrast, it is recognized after compression that the data size can be cut since 12 bits+10 bits+8 bits+8 bits+2 bits=40 bits. In this manner, by changing the data length of difference representation according to the difference from the dose amount of the immediately preceding section (in this example, signed eight bits, signed six bits, or zero bits), data can be compressed and the dose amount information can be represented.

Compared to FIGS. 10 and 11, as illustrated in FIG. 12, by causing the definition sequences of the dose amount to zigzag, the dose amount is likely to be identical to that of an immediately preceding section and data can be compressed efficiently using the above-described technique. For example, as illustrated in FIG. 13, since the section of the dose amount $D_{3\text{-}1}$ adjoins the section of the dose amount $D_{2\text{-}3}$, the dose amounts are likely to be identical in value and the efficiency of the data compression is favorable.

Second Embodiment

According to the above-described first embodiment, trapezoids are partitioned into a plurality of sections and one dose amount is defined for each section and in one section, the dose amount is identical at any position but in the writing data DT1, the dose amounts on both ends of each section may be defined and primary interpolation may be performed on the dose amounts on both ends to determine the dose amount at given coordinates.

For example, as illustrated in FIG. 15, one trapezoid T is partitioned into three sections SC1, SC2, and SC3 according to a mesh size. After that, dose amounts D1, D2, D3, and D4 at four locations are defined, which are the lower end of the section SC1, the upper end of the section SC1 (the lower end of the section SC2), the upper end of the section SC2 (the lower end of the section SC3), the upper end of the section SC3. In writing data DT1, the dose amounts D1, D2, D3, and D4 are sequentially defined.

A control calculator 52 that reads the writing data DT1 can determine a dose amount Dj with pixels pj in the section SC1 by performing primary interpolation on the dose amounts D1 and D2 on both ends of the section SC1. A dose amount Dk with pixels pk in the section SC3 can be determined by performing primary interpolation on the dose amounts D3 and D4 on both ends of the section SC3.

Third Embodiment

Although according to the above-described first embodiment, trapezoids are partitioned into a plurality of sections and one dose amount is defined for each section, the dose amounts on both ends of a trapezoid may be defined without partitioning into a plurality of sections and primary interpolation may be performed on the dose amounts on both ends to determine the dose amount at given coordinates.

Figure 16:
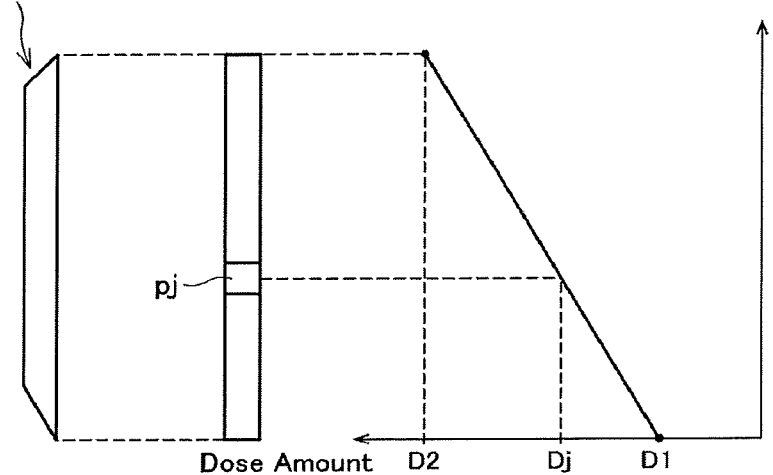
FIG. 16 illustrates a method of defining dose amounts according to a third embodiment.

For example, as illustrated in FIG. 16, dose amounts D1 and D2 at two locations are defined, which are the lower end and upper end of one trapezoid T. In the writing data DT1, the dose amounts D1 and D2 are sequentially defined.

A control calculator 52 that reads writing data DT1 can determine a dose amount Dj with pixels pj in the trapezoid T by performing primary interpolation on the dose amounts D1 and D2 on both ends of the trapezoid T.

Figure 17:
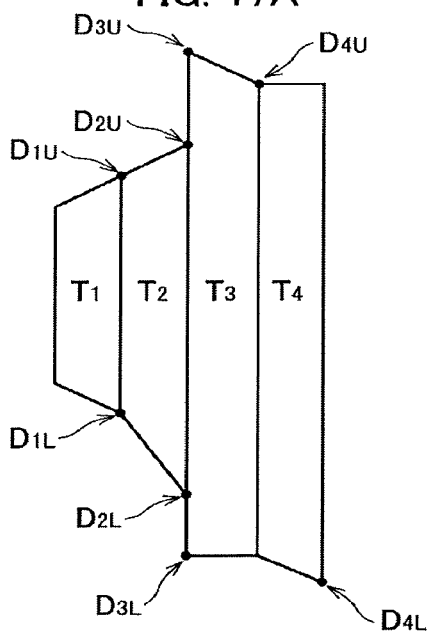
FIG. 17A illustrates an example in which dose amounts are defined for upper and lower ends of trapezoids and FIGS. 17B through 17D each illustrate an example of a data structure of writing data.

As illustrated in FIG. 17A, a case is considered, where $D_{1L}$, $D_{2L}$, $D_{3L}$, and $D_{4L}$ represent dose amounts on the lower ends of trapezoids $T_1$, $T_2$, $T_3$, and $T_4$ and $D_{1U}$, $D_{2U}$, $D_{3U}$, and $D_{4U}$ represent dose amounts on the upper ends thereof. The definition sequence of dose amounts in the writing data DT1 may be, as illustrated in FIG. 17B, the sequence from the lower end to upper end of the trapezoid $T_1$, the lower end to upper end of the trapezoid $T_2$, to the lower end to upper end of the trapezoid $T_3$, or may be, as illustrated in FIG. 17C, the sequence from the upper end to lower end of the trapezoid $T_1$, the upper end to lower end of the trapezoid $T_2$, to the upper end to lower end of the trapezoid $T_3$. For another example, as illustrated in FIG. 17D, a zigzag from the lower end to upper end of the trapezoid $T_1$, the upper end to lower end of the trapezoid $T_2$, to the lower end to upper end of the trapezoid $T_3$ may be defined. FIGS. 17B through 17D each indicate part of the writing data DT1 only, which is the header PHd.

A conversion device 70 may convert dose amount information on the upper end and lower end of a trapezoid to a data structure constituted of a header part, a first value part, and a second value part as indicated in Table 3 below and may compress data. In the example of Table 3, each dose amount before compression is 10 bits.

TABLE 3

| Header Part (1 bit) | | | |
|---|---|---|---|
| Value | Meaning | First value part | Second Value part |
| 0 | Dose amounts on both ends are defined | Unsigned 10 bits | Unsigned 10 bits |
| 1 | Identical to the immediately preceding dose amount | None (0 bits) | None (0 bits) |

When the dose amounts on both ends (the upper and lower ends) of a certain trapezoid are identical to the dose amounts on both ends of an immediately preceding trapezoid, the dose amount information on this trapezoid is represented only by a one-bit header "1", which indicates that the dose amounts are identical to those of the immediately preceding trapezoid.

When at least one of the dose amounts on both ends of a certain trapezoid is different from the dose amounts on both ends of an immediately preceding trapezoid, the dose amount on the lower end is included into the first value part, the dose amount on the upper end is included into the second value part, and a one-bit header "0" indicating that the dose amounts on both ends are defined is added.

Table 4 indicates an example of conversion (data compression) of representation of dose amount information. Although in Table 4, decimal notation is used for the dose amounts before compression and the value parts after compression for convenience of explanation, binary notation is used in actuality.

TABLE 4

| | Before compression | | After Compression | | | |
|---|---|---|---|---|---|---|
| | Lower end | Upper end | Header Part | First Value Part | Second Value Part | Number of bits |
| j-th trapezoid | 808 | 809 | 0 | 808 | 809 | 21 |
| j + 1-th trapezoid | 807 | 809 | 0 | 807 | 809 | 21 |
| j + 2-th trapezoid | 807 | 810 | 0 | 807 | 810 | 21 |
| j + 3-th trapezoid | 807 | 810 | 1 | None | None | 1 |
| j + 4-th trapezoid | 807 | 810 | 1 | None | None | 1 |
| j + 5-th trapezoid | 807 | 810 | 1 | None | None | 1 |
| j + 6-th trapezoid | 807 | 810 | 1 | None | None | 1 |
| j + 7-th trapezoid | 807 | 810 | 1 | None | None | 1 |
| j + 8-th trapezoid | 806 | 809 | 0 | 806 | 809 | 21 |

Regarding the jth through j+2th trapezoids, the dose amounts on both ends are defined and a header "0" is added.

Regarding the j+3th through j+7th trapezoids, since the dose amounts on both ends are identical to the dose amounts on both ends of the j+2th trapezoid, only a one-bit header "1" is used in the representation.

Regarding the j+8th trapezoid, the dose amounts on both ends are defined and a header "0" is added.

The data size before compression of the dose amount information on both ends of the jth through j+8th nine trapezoids is 10 bits×2×9=180 bits. In contrast, after compression, it is recognized that (1+10×2)×4+1×5=89 bits and the data size can be cut.

A conversion device 70 may convert the dose amount information on the upper end and lower end of a trapezoid to a data structure constituted of a header part, a first value part, and a second value part as indicated in Table 5 below and may further compress data.

TABLE 5

| Header part (1 bit) | | | |
|---|---|---|---|
| Value | Meaning | First value part | Second value part |
| 0 | Dose amounts on both ends are defined | Unsigned 10 bits | Unsigned 10 bits |
| 1 | Preceding dose amount is repeated for "the value of the first value part +1" times | Unsigned 3 bits | None (0 bits) |

When trapezoids with identical dose amounts on both ends (the upper and lower ends) thereof are continuous, the dose amount information is represented by a one-bit header "1", which indicates that the dose amounts are identical to those of a preceding trapezoid, and the number of continuous trapezoids identical in dose amount (unsigned three bits).

When at least one of the dose amounts on both ends of a certain trapezoid is different from the dose amounts on both ends of an immediately preceding trapezoid, the dose amount on the lower end is included into the first value part, the dose amount on the upper end is included into the second value part, and a one-bit header "0" indicating that the dose amounts on both ends are defined is added.

Table 6 indicates an example in which the dose amount information before compression indicated in Table 4 is converted with the data structure indicated in Table 5.

TABLE 6

| | After compression | | | |
|---|---|---|---|---|
| Number of definition | Header part | First value part | Second value part | Number of bits |
| 1 | 0 | 808 | 809 | 21 |
| 2 | 0 | 807 | 809 | 21 |
| 3 | 0 | 807 | 810 | 21 |
| 4 | 1 | 4 | None | 4 |
| 5 | 0 | 806 | 809 | 21 |

Since "4" is defined in the first value part that corresponds to the header "1", it is interpreted that the j+2th dose amount is repeated five times. In this example, it is recognized that (1+10×2)×4+(1+3)=88 bits and the data size can further be cut.

Fourth Embodiment

Although in the above-described third embodiment, the dose amounts on both ends of a trapezoid are defined and primary interpolation is performed on the dose amounts on both ends to determine the dose amount at given coordinates, the control calculator 52 may write a rectangular shape that circumscribes a group of a plurality of continuous trapezoids, compute the dose amounts at four vertices of the circumscribed rectangular shape, and calculate the dose amount at given coordinates in the circumscribed rectangular shape by bilinear interpolation on the dose amounts at the four vertices.

A conversion device 70 converts the dose amount information on the upper end and lower end of a trapezoid to a data structure constituted of a header part, a first value part, and a second value part as indicated in Table 7 below.

TABLE 7

| Header part (1 bit) | | | |
|---|---|---|---|
| Value | Meaning | First value part | Second value part |
| 0 | Dose amounts on both ends are defined | Unsigned 10 bits | Unsigned 10 bits |
| 1 | Interpolation region | None (0 bits) | None (0 bits) |

The dose amount information on a trapezoid for which a dose amount is calculated by bilinear interpolation is represented with only a one-bit header "1". Regarding the trapezoids for which the dose amounts on both ends (the upper and lower ends) are defined, "0" is defined in the header part and the dose amount on the lower end is defined in the first value part, and the dose amount on the upper end is defined in the second value part.

Figure 18:
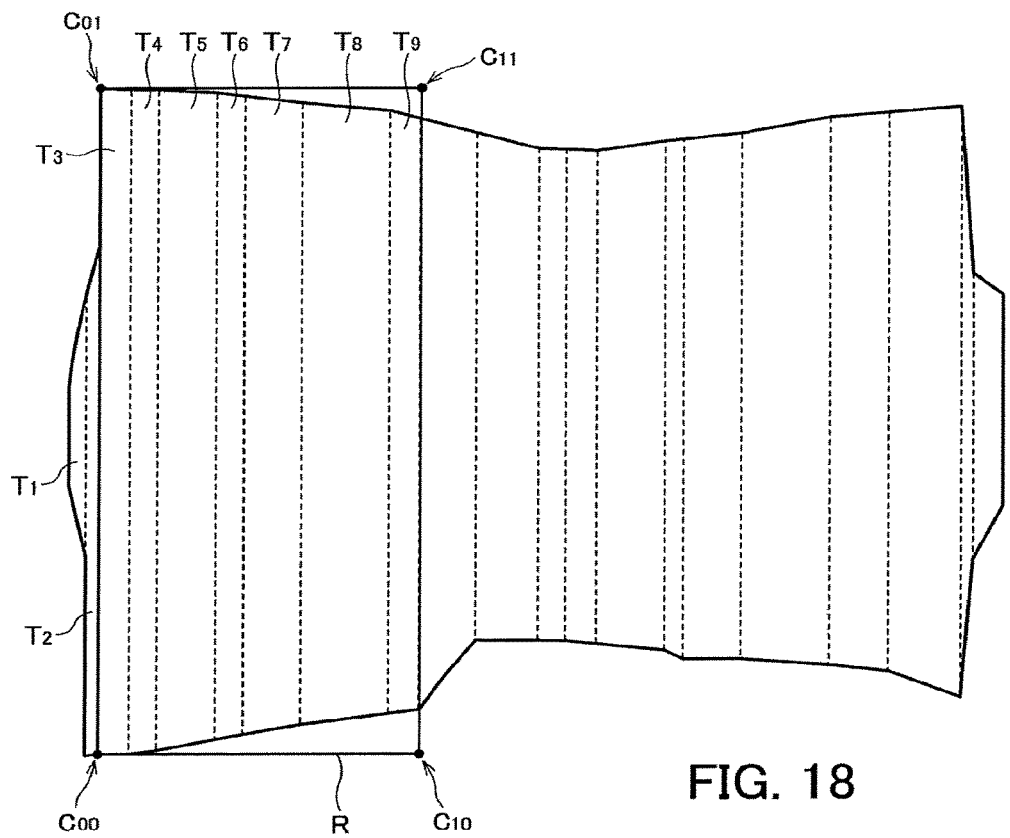
FIG. 18 illustrates an example of a rectangular shape that circumscribes a plurality of trapezoids.

For example, the dose amount information on trapezoids $T_1$ through $T_9$ illustrated in FIG. 18 is represented as in Table 8 below. In this example, it is recognized that regarding the dose amount information on the nine trapezoids $T_1$ through $T_9$, $(1+10\times2)\times4+1\times5=89$ bits and the data size can be cut.

TABLE 8

| | Before | | After Compression | | | |
|---|---|---|---|---|---|---|
| | Lower end | Upper end | Header Part | First Value Part | Second Value Part | Number of bits |
| Trapezoid $T_1$ | 808 | 809 | 0 | 808 | 809 | 21 |
| Trapezoid $T_2$ | 807 | 809 | 0 | 807 | 809 | 21 |
| Trapezoid $T_3$ | 807 | 810 | 0 | 807 | 810 | 21 |
| Trapezoid $T_4$ | 807 | 810 | 1 | None | None | 1 |
| Trapezoid $T_5$ | 807 | 810 | 1 | None | None | 1 |
| Trapezoid $T_6$ | 807 | 810 | 1 | None | None | 1 |
| Trapezoid $T_7$ | 807 | 810 | 1 | None | None | 1 |
| Trapezoid $T_8$ | 807 | 810 | 1 | None | None | 1 |
| Trapezoid $T_9$ | 806 | 809 | 0 | 806 | 809 | 21 |

A control calculator 52 that reads writing data DT1 writes a rectangular shape R that circumscribes the trapezoids $T_3$ through $T_9$ as illustrated in FIG. 18 and calculates the dose amounts at four vertices $C_{00}$, $C_{01}$, $C_{10}$, and $C_{11}$ of the circumscribed rectangular shape R. Dose amounts $d_{00}$ and $d_{01}$ at the vertices $C_{00}$ and $C_{01}$ are dose amounts on the lower end to upper end of the trapezoid $T_3$.

Dose amounts $d_{10}$ and $d_{11}$ at the vertices $C_{10}$ and $C_{11}$ can be determined by interpolation or extrapolation according to the dose amounts on the lower end to upper end of the trapezoid $T_9$.

Figure 19:
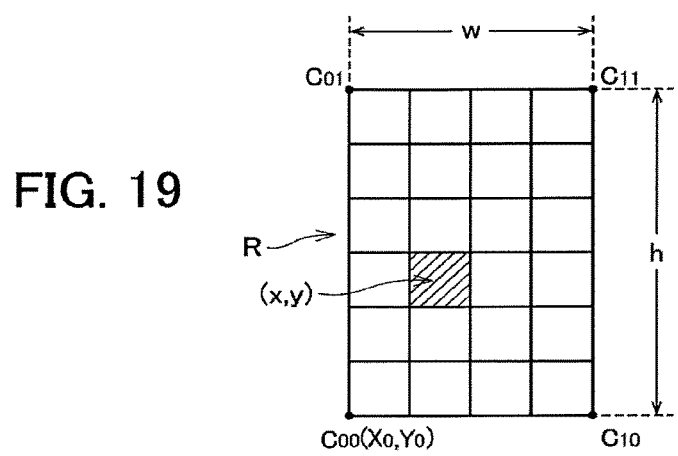
FIG. 19 is a diagram for explaining calculation of a dose amount by bilinear interpolation.

As illustrated in FIG. 19, when w represents a length of the circumscribed rectangular shape R in a left-right direction in the writing and h represents a length of the circumscribed rectangular shape R in an up-down direction in the writing, and the coordinates at the vertex $C_{00}$ are $(X_0, Y_0)$, a dose amount $d(x,y)$ at the coordinates $(x,y)$ can be determined by a bilinear interpolation expression below.

[Mathematical Expression 1]
$$d_{(x,y)} = \frac{1}{w^*h}[d_{00}^*(X_0+w-x)^*(Y_0+h-y) + \\ d_{10}^*(x-X_0)^*(Y_0+h-y) + \\ d_{01}^*(X_0+w-x)^*(y-Y_0) + \\ d_{11}^*(x-X_0)^*(y-Y_0)]$$

By causing the header "1" indicated in Table 7 to mean that an interpolation region is repeated for "the value of the first value part+1" times, the data amount may further be cut.

At least part of the conversion device 70 described in the above embodiments may be implemented in either hardware or software. When implemented in software, a program that realizes at least part of functions of the conversion device 70 may be stored on a recording medium such as CD-ROM and read and executed by a computer. The recording medium is not limited to a removable recording medium such as a magnetic disk or optical disk, but may be a non-removable recording medium such as a hard disk device or memory.

While certain embodiments have been described, these embodiments have been presented by way of example only, and are not intended to limit the scope of the inventions. Indeed, the novel methods and systems described herein may be embodied in a variety of other forms, furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A method of creating writing data used in a multi charged particle beam writing apparatus, the method comprising:
    partitioning a polygonal figure included in design data into a plurality of trapezoids that each include at least one pair of opposite sides parallel along a first direction and that join so as to be continuous in a second direction orthogonal to the first direction while a side parallel to the first direction serves as a common side; and
    creating the writing data by, when a first trapezoid, a second trapezoid, and a third trapezoid join along the second direction, representing a position of a common vertex shared by the second trapezoid and the third trapezoid using displacements in the first direction and the second direction from a position of a common vertex shared by the first trapezoid and the second trapezoid, wherein
    in at least one of the plurality of trapezoids, different dose amounts are defined in the first direction.

2. The method according to claim 1, wherein
a trapezoid that is included in the plurality of trapezoids and has a length in the first direction larger than a predetermined size is partitioned along the first direction into a plurality of sections according to the predetermined size and a dose amount is defined for each section to create the writing data.

3. The method according to claim 2, wherein
when the first direction is an up-down direction, in the writing data, respective dose amounts of sections of the first trapezoid are sequentially defined upward from a section on a lower side and respective dose amounts of sections of the second trapezoid are sequentially defined downward from a section on an upper side.

4. The method according to claim 3, wherein
a dose amount of each section is converted to representation of difference from a dose amount of a section that immediately precedes in a definition sequence.

5. The method according to claim 1, wherein
for each section, dose amounts on both ends in the first direction are defined to create the writing data.

6. The method according to claim 1, wherein
for each trapezoid, dose amounts on both ends in the first direction are defined to create the writing data.

7. The method according to claim 6, wherein
when dose amounts on both ends of the second trapezoid in the first direction are identical to dose amounts on both ends of the first trapezoid in the first direction,
dose amount information on the first trapezoid includes a header part that indicates that the dose amounts on the both ends in the first direction are defined, and a value part that indicates the dose amounts on the both ends, and
dose amount information on the second trapezoid includes a header part that indicates that the dose amounts on both ends of the second trapezoid are identical to the dose amounts on both ends of the first trapezoid, and includes no value part.

8. The method according to claim 1, wherein
dose amount information on an nth trapezoid, where n represents an integer larger than or equal to two, is converted to representation indicating that the dose amount information on the nth trapezoid is determined by performing bilinear interpolation on dose amount information on both ends in the first direction of an n−1th trapezoid or a trapezoid before the n−1th trapezoid and dose amount information on both ends in the first direction of an n+1th trapezoid or a trapezoid after the n+1th trapezoid.

* * * * *